United States Patent
Illek et al.

(10) Patent No.: US 8,293,553 B2
(45) Date of Patent: Oct. 23, 2012

(54) METHOD FOR PRODUCING AN AREA HAVING REDUCED ELECTRICAL CONDUCTIVITY WITHIN A SEMICONDUCTOR LAYER AND OPTOELECTRONIC SEMICONDUCTOR ELEMENT

(75) Inventors: Stefan Illek, Donaustauf (DE); Wilhelm Stein, Lindau (DE); Robert Walter, Parsberg (DE); Ralph Wirth, Pettendorf-Adlersberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 1139 days.

(21) Appl. No.: 11/597,928

(22) PCT Filed: Apr. 25, 2005

(86) PCT No.: PCT/DE2005/000753
§ 371 (c)(1),
(2), (4) Date: Jan. 16, 2008

(87) PCT Pub. No.: WO2005/117147
PCT Pub. Date: Dec. 8, 2005

(65) Prior Publication Data
US 2009/0008751 A1 Jan. 8, 2009

(30) Foreign Application Priority Data

May 28, 2004 (DE) .......................... 10 2004 026 231

(51) Int. Cl.
*H01L 21/00* (2006.01)
*H01L 23/58* (2006.01)
(52) U.S. Cl. ............ 438/46; 438/47; 438/508; 438/559; 438/563; 257/632; 257/E21.124; 257/E21.462; 257/E21.542; 257/E23.001
(58) Field of Classification Search ........................ None
See application file for complete search history.

(56) References Cited

U.S. PATENT DOCUMENTS 3,798,083 A * 3/1974 Schmidt ........................ 438/551
(Continued)

FOREIGN PATENT DOCUMENTS

CN 2593370 12/2003
(Continued)

OTHER PUBLICATIONS

Kovacik et al., "Application of ZnO Films for Zno/GaInP Heterojunction Bipolar Phototransistors Preparation", j. Electrical Engineering, Elektrotechnicka Fakulta Stu., Bratislava, SL vol. 46, No. 11, pp. 370-374, 1995.
Lawrence et al., "Zinc Diffusion Process for $GaAs_{0.6}P_{0.4}$ Red Light Emitting Diode Fabrication in an Undergraduate Laboratory", Proceedings of the $12^{th}$ Biennial University/Government/Industry Microelectronics Symposium. UGIM '97, Rochester, NY, pp. 169-172, Jul. 20-23, 1997.

(Continued)

*Primary Examiner* — Mary Wilczewski
*Assistant Examiner* — Khanh Duong
(74) *Attorney, Agent, or Firm* — Cozen O'Connor

(57) ABSTRACT

In a method for producing at least at least one area (8) with reduced electrical conductivity within an electrically conductive III-V semiconductor layer (3), a ZnO layer (1) is applied to the area (8) of the semiconductor layer (3) and subsequently annealed at a temperature preferably between 300° C. and 500° C. The ZnO layer (1) is preferably deposited on the III-V semiconductor layer (3) at a temperature of less than 150° C., preferably at a temperature greater than or equal to 25° C. and less than or equal to 120° C. The area (8) with reduced electrical conductivity is preferably located in a radiation emitting optoelectronic device between the active zone (4) and a connecting contact (7) in order to reduce current injection into the areas of the active zone (4) located opposite to the connecting contact (7).

22 Claims, 2 Drawing Sheets

U.S. PATENT DOCUMENTS

| | | | |
|---|---|---|---|
| 5,023,199 A * | 6/1991 | Murakami et al. | 438/47 |
| 5,108,949 A * | 4/1992 | Takahashi | 438/45 |
| 5,122,478 A * | 6/1992 | Uesugi | 438/508 |
| 5,135,581 A * | 8/1992 | Tran et al. | 136/256 |
| 6,356,572 B1 * | 3/2002 | Tanaka et al. | 372/45.01 |
| 6,727,522 B1 | 4/2004 | Kawasaki et al. | |
| 2002/0146866 A1 | 10/2002 | Nomura et al. | |
| 2003/0012241 A1 | 1/2003 | Onishi | |

FOREIGN PATENT DOCUMENTS

| | | |
|---|---|---|
| CN | 1517454 | 8/2004 |
| EP | 0 723 285 | 7/1996 |
| EP | 1 523 047 A | 4/2005 |
| JP | 7-169993 | 7/1995 |
| JP | 7-307409 | 11/1995 |
| JP | 07307490 | 11/1995 |
| JP | 11-112078 | 4/1999 |
| JP | 2000-138419 | 5/2000 |
| JP | 2002 016287 | 1/2002 |

OTHER PUBLICATIONS

Nakahara et al., "Improved External Efficiency InGaN-Based Light-Emitting Diodes with Transparent Conductive Ga-Doped ZnO as P-Electrodes", Japanese Journal of Applied Physics, Tokyo, Japan, vol. 43, No. 2A, pp. L180-L182, Feb. 1, 2004.

Nishizono et al., "Metal/Al-Doped ZnO Ohmic Contact for AlGaN/GaN High Electron Mobility Transistor", Applied Physics Letters, American Institute of Physics, New York, US, vol. 84, No. 20, pp. 3996-3998, May 17, 2004.

A. Shima, "670nm Window Laser Diode Performs 150mW Single Transverse-Mode Operation", JEE Journal of Electronic Engineering, DEMPA Publications Inc., Tokyo, Japan, vol. 30, No. 313, pp. 100-103, Jan. 1993.

* cited by examiner

METHOD FOR PRODUCING AN AREA HAVING REDUCED ELECTRICAL CONDUCTIVITY WITHIN A SEMICONDUCTOR LAYER AND OPTOELECTRONIC SEMICONDUCTOR ELEMENT

RELATED APPLICATIONS

This is a U.S. national stage of application No. PCT/DE2005/000753, filed on Apr. 24, 2005.

This patent application claims the priority of the German patent application 102004026231.4-33, whose subject matter is hereby incorporated by reference.

FIELD OF THE INVENTION

The invention relates to a method of producing an electrically conductive III-V semiconductor layer having at least one area with reduced electrical conductivity, and an optoelectronic semiconductor device with such a layer.

BACKGROUND OF THE INVENTION

Control of current flow through the semiconductor body by means of discrete subareas of the semiconductor layers in order to increase the efficiency of the device is often desired in connection with optoelectronic semiconductor devices, in particular luminescence diodes or semiconductor laser devices.

For example, no current should be injected under an electrical connecting contact (bond pad) in a radiation emitting optoelectronic device, because a relatively large part of the electromagnetic radiation that would be created in areas of the active zone under the connecting contact would be absorbed, and could therefore not be emitted from the device.

Restricting the current-flow area of the optoelectronic semiconductor device to a subarea of the semiconductor chip is often also desired in order to achieve increased charge carrier density in this subarea and therefore a shorter switching time for the optoelectronic device.

Known methods of influencing the current path through an optoelectronic semiconductor device are underlying the electrical connecting contact with an insulating layer, implantation of protons in subareas of a semiconductor layer, or selective oxidation of epitaxially produced AlAs layers in order to create current limiting apertures.

However, for semiconductor materials with high transversal conductivity, the effectiveness of underlying the connecting contact with an insulating layer is restricted to areas close to the surface, since the conductivity of the semiconductor itself is not affected. On the other hand, the previously mentioned methods of proton implantation and selective oxidation of AlAs layers can be used to change the conductivity of discrete subareas of a semiconductor layer. These methods are, however, technically relatively complex.

SUMMARY OF THE INVENTION

One object of the invention is to provide a method that allows an area with reduced electrical conductivity to be created at relatively low cost within an electrically conductive III-V semiconductor layer and to provide an advantageous optoelectronic device with a III-V semiconductor layer of this type.

This and other objects are attained in accordance with one aspect of the present invention directed to a method for producing at least one area having reduced electrical conductivity within an electrically conducting III-V semiconductor layer, a ZnO layer is applied on said area of the semiconductor layer and subsequently annealed.

Use of the invention therefore advantageously produces an area within a III-V semiconductor layer that has reduced electrical conductivity compared to the area or areas of the III-V semiconductor layer adjacent to the area. For example, the III-V semiconductor layer has an electrical conductivity of $\sigma_1$, and an area with electrical conductivity $\sigma_2$, which is reduced compared to $\sigma_1$, is created within the electrically conductive III-V semiconductor layer, such that $\sigma_2 < \sigma_1$.

The ZnO layer is preferably deposited on the III-V semiconductor material at a temperature of less than 150° C., preferably at a temperature greater than or equal to 25° C. and less than or equal to 120° C. The ZnO layer is advantageously applied by sputtering. The subsequent annealing is preferably performed at a temperature of approximately 300° C. to 500° C.

The ZnO layer can, for example, be structured using photolithography or a lift-off technique to define the area in which the conductivity of the semiconductor layer is to be reduced. The ZnO layer can be doped with Al in order to improve its conductivity, preferably at a concentration of up to 3%.

The invention is based on the insight that the electrical conductivity, and in particular the transverse conductivity, of a III-V semiconductor layer can be specifically influenced by the application of a ZnO layer and a subsequent annealing process. In particular, it has been shown that the reduction in conductivity of the III-V semiconductor layer is highly dependent on the temperature at which the ZnO layer is applied. When a deposition temperature of less than 150° C. is used, for example, it is possible to reduce the conductivity of a III-V semiconductor layer by at least a factor of 2, preferably by at least a factor of 5 and especially preferably even by at least a factor of 10. On the other hand, the conductivity of a III-V semiconductor layer is at least less strongly affected by the application of a ZnO layer at a temperature higher than 150° C., for example at approximately 250° C., with subsequent annealing, preferably even only insignificantly affected.

The ZnO layer can be removed after annealing or may also remain on the semiconductor layer and, for example, function as a current dispersing layer within an optoelectronic device.

The method according to the invention is particularly suitable for a III-V semiconductor layer containing one of the semiconductor materials $In_{1-x-y}Ga_xAl_yP$ with $0 \leq x+y \leq 1$, $0 \leq x \leq 1$, $0 \leq y \leq 1$ or $Al_{1-x}Ga_xAs$ with $0 \leq x \leq 1$. The III-V semiconductor layer is preferably p-doped.

In a preferred method according to the invention, the III-V semiconductor layer is contained in an optoelectronic device, in particular in a luminescence diode or a semiconductor laser device. In an especially preferred embodiment, the optoelectronic device contains a radiation emitting active zone and the current flow through subareas of the active zone is reduced by the area with reduced electrical conductivity. For this purpose, the area with reduced electrical conductivity is advantageously positioned between an electrical connecting contact of the optoelectronic device and the active zone.

An advantageous variant of the method according to the invention consists of depositing a first ZnO layer on a first area of the semiconductor layer and a second ZnO layer on a second area of the semiconductor layer, with the deposition temperature of the second ZnO layer increased relative to the deposition temperature of the first ZnO layer such that the conductivity of the second area of the semiconductor layer is at least reduced less during annealing than the conductivity of the first area. The second ZnO layer is preferably applied at a temperature above 150° C., for example at approximately 250° C.

The invention furthermore provides for an optoelectronic semiconductor device containing a III-V semiconductor layer with at least one area with reduced electrical conductivity produced with a method according to the invention.

Another aspect of the present invention is directed to an optoelectronic semiconductor device according to the invention has a III-V semiconductor layer that is covered in at least one first area by a ZnO layer, with the conductivity in the semiconductor body in the first area covered by the ZnO layer being lower than in the laterally adjacent areas of the semiconductor layer.

The electrical conductivity of the first area of the III-V semiconductor layer is advantageously at least a factor of 2, preferably at least a factor of 5 and especially preferably at least a factor of 10 lower than in the lateral adjacent areas of the semiconductor layer. The III-V semiconductor layer preferably contains one of the semiconductor materials $In_{1-x-y}Ga_xAl_yP$ with $0 \leq x+y \leq 1$, $0 \leq x \leq 1$, $0 \leq y \leq 1$ or $Al_{1-x}Ga_xAs$ with $0 \leq x \leq 1$.

A second ZnO layer can be deposited on a second area of the semiconductor layer, with the conductivity of the second area of the semiconductor layer greater than the conductivity of the first area.

In particular, the first ZnO layer and the second ZnO layer can be adjacent and can be positioned between the III-V semiconductor layer and the connecting contact of an optoelectronic device. In this way, the first ZnO layer and the second ZnO layer together advantageously form a current dispersing layer.

An optoelectronic semiconductor device preferably contains a radiation emitting active zone, with the area with reduced electrical conductivity positioned between an electrical connecting contact of the optoelectronic device and the active zone in order to reduce current injection in an area of the active zone located opposite to the connecting contact. This reduces the generation of radiation in this area, therefore advantageously reducing the absorption in the connecting contact.

BRIEF DESCRIPTION OF THE DRAWINGS

The invention is described below in detail using two embodiments in conjunction with FIGS. 1 and 2, in which.

DETAILED DESCRIPTION OF THE DRAWINGS

Identical or equally acting elements are shown with the same labels in the Figures.

Figure 1A:
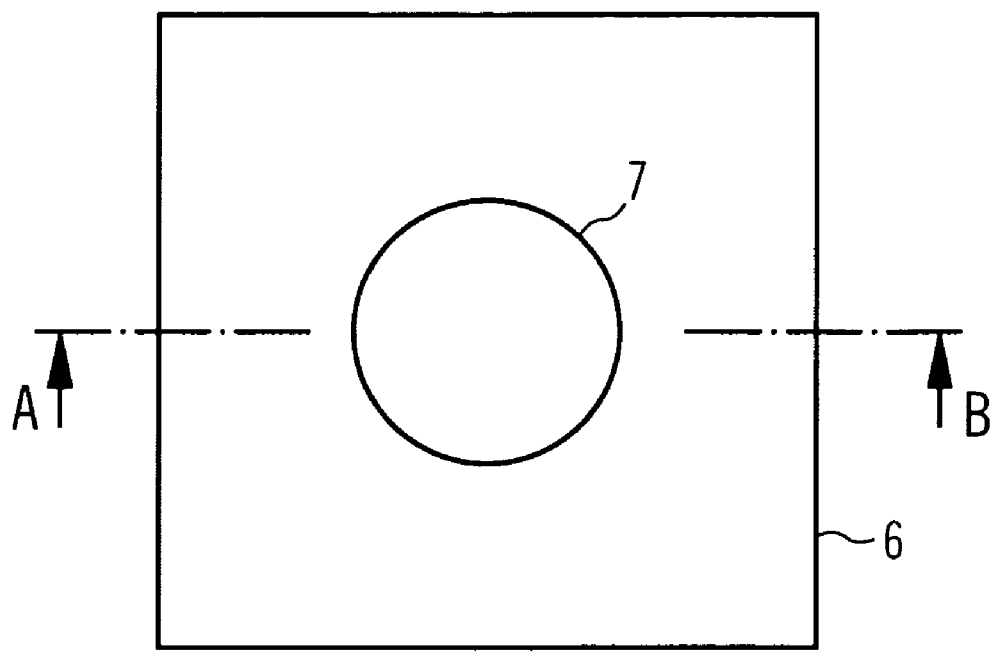
FIG. 1A is a schematic top view of an optoelectronic device according to a first embodiment of the invention.
Figure 1B:
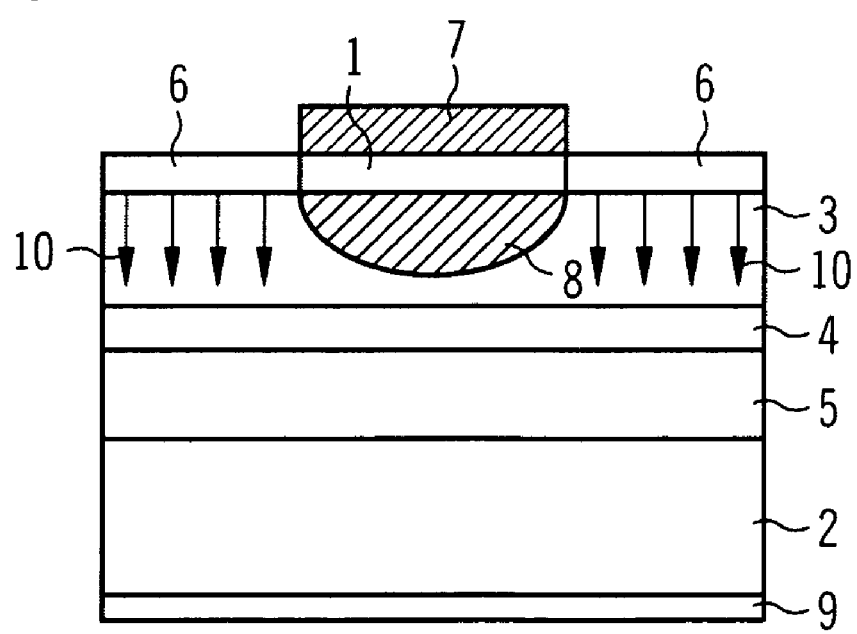
FIG. 1B is a schematic cross-section along line AB of the embodiment of the invention shown in FIG. 1A.

The first embodiment of an optoelectronic device according to the invention shown in FIGS. 1A and 1B contains at least one p-doped III-V semiconductor layer 3 and at least one n-doped semiconductor layer 5 on a substrate 2, with a radiation emitting active zone 4 formed between them. According to the invention, the semiconductor layer sequence 3, 4, 5 schematically depicted in FIG. 1B can consist of any desired configuration customarily used for luminescence diodes or semiconductor laser devices. In particular, quantum layers can also be provided as the radiation emitting active zone 4.

A first ZnO layer 1, deposited using sputtering at a temperature between 25° C. and 120° C., is applied to subarea 8 of the III-V semiconductor layer. An annealing process performed at a temperature of between 300° C. and 500° C. after deposition of the first ZnO layer 1 created an area 8 with reduced electrical conductivity in III-V semiconductor layer 3.

A second ZnO layer 6 is located laterally adjacent to the first ZnO layer 1 and, unlike the first ZnO layer, was applied at a deposition temperature greater than 150° C., for example approximately 250° C.

Application of the first ZnO layer 1 and the second ZnO layer 6 can, for example, be performed so that the second ZnO layer 6 is applied to the entire surface of the III-V semiconductor layer 3 and is then covered by a masking layer with a hole in the subarea provided for the first ZnO layer. The second ZnO layer 6 is removed in this subarea using, for example, an etching process and the first ZnO layer 1 then applied at a deposition temperature of less than 150° C. A first connecting contact 7 is then applied. The deposited material of the first ZnO layer 1 and the connecting contact 7 can be lifted off together with the masking layer (lift-off technique) from the masking layer covered areas of the second ZnO layer 6 where it has been deposited. Annealing is then performed at a temperature between 300° C. and 500° C. in order to create the area 8 with reduced electrical conductivity under the first ZnO layer 1.

The current flow from an electrical connecting contact 7 on the first ZnO layer 1 to a second connecting contact 9 located, for example, on the side of substrate 2 facing away from the active zone 4, is advantageously channeled into the areas of active zone 4 not facing connecting contact 7 by the area 8 of reduced electrical conductivity. The preferred current path from the connecting contact 7 to active zone 4 within semiconductor layer 3 is indicated by arrow 10 in FIG. 1B. This current path 10 has the advantage that only an insignificant fraction of the radiation emitted from the optoelectronic device is generated in the areas of active zone 4 facing connecting contact 7, thereby reducing absorption losses in connecting contact 7.

The first ZnO layer 1 and second ZnO layer 6 are adjacent in this embodiment and jointly form a current dispersing layer. It is advantageous if the ZnO layers 1, 6 are doped with up to three percent Al. Owing to the good transversal conductivity of ZnO layers 1, 6, which is also retained during the annealing method step, the current from connecting contact 7 can be injected through the first ZnO layer 1 and second ZnO layer 6 into the area with no or only slightly reduced electrical conductivity of the III-V semiconductor layer 3.

Figure 2A:
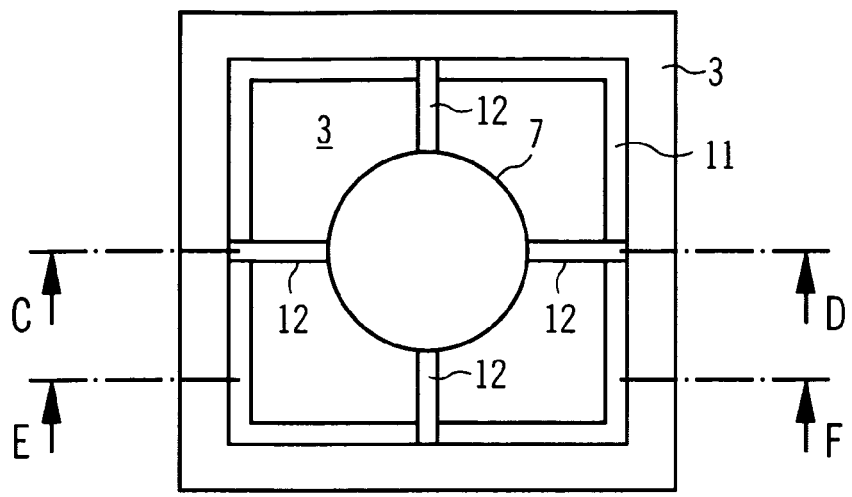
FIG. 2A is a schematic top view of an optoelectronic device according to a second embodiment of the invention.
Figure 2B:
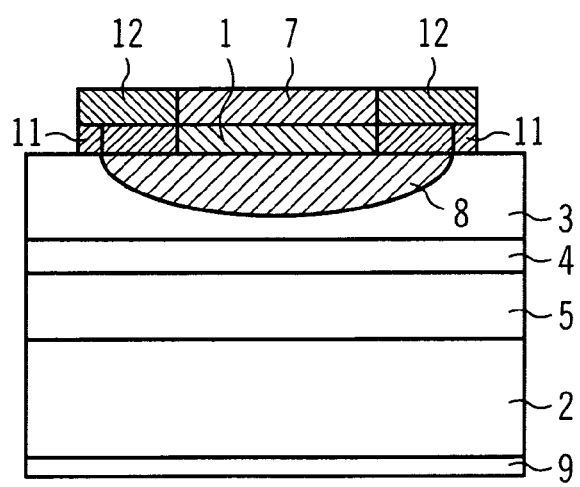
FIG. 2B is a schematic cross-section along line CD of the embodiment of the invention shown in FIG. 2A.
Figure 2C:
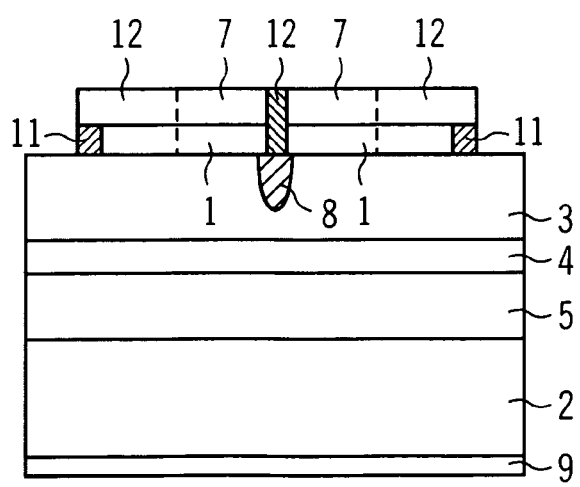
FIG. 2C is a schematic cross-section along line EF of the embodiment of the invention shown in FIG. 2A.

The second embodiment of an optoelectronic device according to the invention shown in FIGS. 2A, 2B and 2C primarily differs from the one shown in FIG. 1 in that the current injection into the semiconductor layer 3 takes place through a contact layer 11 applied in structured form on semiconductor layer 3, not through a second ZnO layer 6. Contact layer 11 is preferably a metal layer suited to forming Ohmic contact with semiconductor layer 3, and can in particular comprise Au, Zn or a combination of these materials.

As can be seen in FIG. 2A, contact layer 11 is structured such that it has the shape of a square when seen from the top. Alternatively, contact layer 11 can also have a different structure. Contact layer 11 is connected to centrally located connecting contact 7 via connecting bars 12.

As can be seen in the cross-sections in FIGS. 2B and 2C, just as in the first embodiment, the connecting contact 7 is located on the first ZnO layer 1, which was applied and annealed on III-V semiconductor layer 3 according to the method described above to reduce the conductivity of the underlying area. In this embodiment, therefore, the conductivity of semiconductor layer 3 is also reduced in an area 8 located opposite to connecting contact 7, so that the current injection through contact layer 11 preferably takes place in those areas of active zone 4 that are not located opposite to connecting contact 7. This reduces absorption in connecting contact 7 of the radiation emitted by the optoelectronic device, thereby increasing the efficiency of the device.

The invention is not restricted by the description on the basis of the exemplary embodiments. Instead, the invention comprises any new features and any combination of features, containing in particular any combination of features in the patent claims, even if this feature or combination is not explicitly indicated in the patent claims or exemplary embodiments.

The invention claimed is:

1. A method for producing at least one area having reduced electrical conductivity within an electrically conductive III-V semiconductor layer, comprising:
    applying a ZnO layer on the area of the electrically conductive III-V semiconductor layer; and
    subsequently annealing;
    wherein a first ZnO layer is deposited on a first area of the electrically conductive III-V semiconductor layer, and a second ZnO layer is deposited on a second area of the electrically conductive III-V semiconductor layer, with a deposition temperature of the second ZnO layer increased relative to a deposition temperature of the first ZnO layer such that a conductivity of the second area of the electrically conductive III-V semiconductor layer is at least less reduced than a conductivity of the first area of the electrically conductive III-V semiconductor layer during annealing.

2. The method of claim 1, wherein the first ZnO layer is deposited on the electrically conductive III-V semiconductor layer at a temperature of less than 150° C.

3. The method according to claim 1, wherein the deposition of the first ZnO layer is performed by sputtering.

4. The method of claim 1, wherein the ZnO layers are structured before annealing.

5. The method of claim 1, wherein the annealing is performed at a temperature between 300° C. and 500° C.

6. The method of claim 1, wherein the ZnO layers are doped with Al.

7. The method of claim 1, wherein the electrically conductive III-V semiconductor layer comprises $In_{1-x-y}Ga_xAl_yP$ with $0 \leq x+y \leq 1$, $0 \leq x \leq 1$, $0 \leq y \leq 1$ or $Al_{1-x}Ga_xAs$ with $0 \leq x \leq 1$.

8. The method of claim 1, wherein the electrically conductive III-V semiconductor layer is p-doped.

9. The method of claim 1, wherein the electrically conductive III-V semiconductor layer is contained in an optoelectronic device.

10. The method according to claim 9, wherein the optoelectronic device contains a radiation emitting active zone and a current flow through subareas of active zone is reduced by the area having the reduced electrical conductivity.

11. The method according to claim 10, wherein the area having the reduced electrical conductivity is positioned between an electrical connecting contact of the optoelectronic device and the radiation emitting active zone.

12. The method of claim 1, wherein the ZnO layer is removed after the annealing.

13. The method according to claim 1, wherein the second ZnO layer is deposited at a temperature greater than 150° C.

14. The method of claim 1, wherein the first ZnO layer is deposited on the electrically conductive III-V semiconductor layer at a temperature of between 25° C. inclusive and 120° C. inclusive.

15. The method of claim 1, wherein an electrical conductivity of the first area of the III-V semiconductor layer is reduced by at least a factor of 2, relative to laterally adjacent areas of the III-V semiconductor layer.

16. The optoelectronic semiconductor device according to claim 1, wherein an electrical conductivity of the first area of the III-V semiconductor layer is reduced by at least a factor of 2, relative to laterally adjacent areas of the III-V semiconductor layer.

17. An optoelectronic semiconductor device with a III-V semiconductor layer that is covered with a ZnO layer in at least a first area, wherein a conductivity of the III-V semiconductor layer in the first area covered by the ZnO layer is lower than in laterally adjacent areas of the III-V semiconductor layer, and wherein a second ZnO layer is deposited on a second area of the III-V semiconductor layer and a conductivity of the second area of the III-V semiconductor layer is greater than a conductivity of the first area.

18. The optoelectronic semiconductor according to claim 17, wherein the ZnO layers are doped with Al.

19. The optoelectronic semiconductor according to claim 17, wherein the III-V semiconductor layer comprises $In_{1-x-y}Ga_xAl_yP$ with $0 \leq x+y \leq 1$, $0 \leq x \leq 1$, $0 \leq y \leq 1$ or $Al_{1-x}Ga_xAs$ with $0 \leq x \leq 1$.

20. The optoelectronic semiconductor device according to claim 17, wherein the first ZnO layer and the second ZnO layer are adjacent to one another and located between the III-V semiconductor layer and a connecting contact of the optoelectronic device.

21. The optoelectronic semiconductor device according to claim 20, wherein the first ZnO layer and the second ZnO layer jointly form a current dispersing layer.

22. The optoelectronic semiconductor according to claim 17, that contains a radiation emitting active zone and in which the first area with reduced electrical conductivity is located between an electrical connecting contact of the optoelectronic device and the active zone.

* * * * *